United States Patent
Ma et al.

(10) Patent No.: US 10,790,119 B2
(45) Date of Patent: Sep. 29, 2020

(54) PLASMA PROCESSING APPARATUS WITH POST PLASMA GAS INJECTION

(71) Applicants: Mattson Technology, Inc., Fremont, CA (US); Beijing E-Town Semiconductor Technology, Co., LTD, Beijing (CN)

(72) Inventors: Shawming Ma, Sunnyvale, CA (US); Vladimir Nagorny, Tracy, CA (US); Dixit V. Desai, Pleasanton, CA (US); Ryan Pakulski, Discovery Bay, CA (US)

(73) Assignees: MATTSON TECHNOLOGY, INC, Fremont, CA (US); BEIJING E-TOWN SEMICONDUCTOR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/851,922

(22) Filed: Dec. 22, 2017

(65) Prior Publication Data

US 2018/0358208 A1     Dec. 13, 2018

Related U.S. Application Data

(60) Provisional application No. 62/517,365, filed on Jun. 9, 2017.

(51) Int. Cl.
*H01L 21/311*     (2006.01)
*H01J 37/32*     (2006.01)
(Continued)

(52) U.S. Cl.
CPC ...... *H01J 37/32422* (2013.01); *B08B 7/0035* (2013.01); *H01J 37/3244* (2013.01);
(Continued)

(58) Field of Classification Search
CPC ............. H01J 37/32422; H01J 37/3244; H01J 2237/002; B08B 7/0035; H01L 21/02057; H01L 21/31138; H01L 21/67028
See application file for complete search history.

(56) References Cited

U.S. PATENT DOCUMENTS 5,811,022 A    9/1998  Savas
5,838,121 A    11/1998 Fairbaim
(Continued)

FOREIGN PATENT DOCUMENTS

JP       2013098172       5/2013
WO    WO-2016171451 A1 * 10/2016 ........... H01L 21/205

OTHER PUBLICATIONS

PCT International Search Report and Written Opinion for corresponding PCT Application No. PCT/US2018/020098, dated Jun. 22, 2018, 13 pages.

(Continued)

*Primary Examiner* — Sharidan Carrillo
(74) *Attorney, Agent, or Firm* — Dority & Manning, P.A.

(57) ABSTRACT

Plasma processing with post plasma gas injection is provided. In one example implementation, a plasma processing apparatus includes a plasma chamber. The apparatus includes a processing chamber separated from the plasma chamber. The processing chamber includes a substrate holder operable to support a workpiece. The apparatus includes a plasma source configured to generate a plasma in the plasma chamber. The apparatus includes a separation grid separating the plasma chamber from the processing chamber. The separation grid can be configured to filter one or more ions generated in the plasma and allow the passage of neutral particles from the plasma chamber to the process- (Continued)

ing chamber. The apparatus can include at least one gas port configured to inject a gas into neutral particles passing through the separation grid.

3 Claims, 16 Drawing Sheets

(51) Int. Cl.
  *H01L 21/67* (2006.01)
  *B08B 7/00* (2006.01)
  *H01L 21/02* (2006.01)
(52) U.S. Cl.
  CPC .. *H01L 21/02057* (2013.01); *H01L 21/31138* (2013.01); *H01L 21/67028* (2013.01); *H01J 2237/002* (2013.01)

(56) References Cited

U.S. PATENT DOCUMENTS

| | | | |
|---|---|---|---|
| 5,897,713 A | 4/1999 | Tomioka | |
| 6,013,155 A * | 1/2000 | McMillin | C23C 16/455 118/723 I |
| 6,286,451 B1 | 9/2001 | Ishikawa | |
| 6,388,383 B1 | 5/2002 | Ni | |
| 6,635,117 B1 | 10/2003 | Kinnard | |
| 8,617,347 B2 | 12/2013 | Kim | |
| 8,920,600 B2 | 12/2014 | Godyak | |
| 8,980,763 B2 | 3/2015 | Wang et al. | |
| 9,214,319 B2 | 12/2015 | Nagorny et al. | |
| 2002/0023899 A1 | 2/2002 | Khater | |
| 2002/0170678 A1 | 11/2002 | Hayashi | |
| 2005/0026436 A1 | 2/2005 | Hogan et al. | |
| 2005/0211170 A1 | 9/2005 | Hanawa et al. | |
| 2006/0005856 A1 | 1/2006 | Sun et al. | |
| 2008/0093341 A1 | 4/2008 | Turlot et al. | |
| 2008/0156440 A1 * | 7/2008 | Sago | C23C 16/45565 156/345.34 |
| 2008/0178805 A1 | 7/2008 | Paterson et al. | |
| 2008/0210378 A1 | 9/2008 | Lee | |
| 2009/0028761 A1 | 1/2009 | Devine | |
| 2010/0247809 A1 | 9/2010 | Neal | |
| 2011/0014397 A1 | 1/2011 | Yang | |
| 2012/0074126 A1 | 3/2012 | Bang et al. | |
| 2014/0166616 A1 * | 6/2014 | Shanker | C23C 16/50 216/67 |
| 2014/0190635 A1 | 7/2014 | Lee | |
| 2014/0197136 A1 | 7/2014 | Nagorny | |
| 2014/0251540 A1 * | 9/2014 | Seo | C23C 16/45565 156/345.29 |
| 2014/0320017 A1 | 10/2014 | Chae | |
| 2015/0060013 A1 | 3/2015 | Buchberger | |
| 2015/0072538 A1 * | 3/2015 | Spurlin | H01L 21/67207 438/798 |
| 2015/0083582 A1 | 3/2015 | Dhindsa et al. | |
| 2015/0118862 A1 * | 4/2015 | Reilly | C23C 16/02 438/778 |
| 2015/0147488 A1 * | 5/2015 | Choi | C23C 16/45523 427/569 |
| 2015/0197853 A1 * | 7/2015 | Ishibashi | C23C 16/4584 118/723 R |
| 2015/0221479 A1 | 8/2015 | Chen | |
| 2015/0348755 A1 * | 12/2015 | Han | H01J 37/3244 118/723 IR |
| 2015/0371828 A1 * | 12/2015 | Stowell | H01J 37/32192 216/69 |
| 2017/0207077 A1 | 7/2017 | Nagorny et al. | |
| 2017/0301514 A1 | 10/2017 | Cho | |
| 2018/0122638 A1 * | 5/2018 | Jung | H01L 21/205 |
| 2018/0358204 A1 | 12/2018 | Ma et al. | |
| 2018/0358206 A1 | 12/2018 | Ma et al. | |
| 2018/0358208 A1 * | 12/2018 | Ma | H01L 21/67028 |
| 2018/0358210 A1 | 12/2018 | Ma et al. | |

OTHER PUBLICATIONS

PCT International Preliminary Report on Patentability for corresponding PCT Application No. PCT/US2018/020099, dated Dec. 10, 2019, 10 pages.
Definition of adjacent from Merriam-Webster Dictionary (Year: 2019)—1 page.
Merriam Webster Dictionary definition of Flaring accessed from https://www.merriam-webster.com/dictionary/flaring on Mar. 25, 2020—1 page.
U.S. Appl. No. 15/892,723, filed Feb. 9, 2018, Shawming Ma et al., Plasma Strip Tool With Multiple Gas Injection Zones.
U.S. Appl. No. 15/888,257, filed Feb. 5, 2018, Shawming Ma et al., Plasma Strip Tool With Uniformity Control.
U.S. Appl. No. 15/888,283, filed Feb. 5, 2018, Shawming Ma et al., Plasma Processing Apparatus.

* cited by examiner

PLASMA PROCESSING APPARATUS WITH POST PLASMA GAS INJECTION

PRIORITY CLAIM

The present application claims the benefit of priority of U.S. Provisional Application Ser. No. 62/517,365, titled "Plasma Strip Tool with Uniformity Control," filed Jun. 9, 2017, which is incorporated herein by reference for all purposes.

FIELD

The present disclosure relates generally to apparatus, systems, and methods for processing a substrate using a plasma source.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Plasma processing apparatus can be used for strip processes, such as photoresist removal. Plasma strip tools can include a plasma chamber where plasma is generated and a separate processing chamber where the substrate is processed. The processing chamber can be "downstream" of the plasma chamber such that there is no direct exposure of the substrate to the plasma. A separation grid can be used to separate the processing chamber from the plasma chamber. The separation grid can be transparent to neutral particles but not transparent to charged particles from the plasma. The separation grid can include one or more sheets of material with holes.

Uniformity control in a plasma strip tool can be important for improved performance (e.g., improved ash rate performance). Uniformity can be difficult to tune in a plasma strip tool without manipulating process parameters, such gas pressure and flow, and RF power provided to induction coils used to generate the plasma.

SUMMARY

Aspects and advantages of embodiments of the present disclosure will be set forth in part in the following description, or may be learned from the description, or may be learned through practice of the embodiments.

One example aspect of the present disclosure is directed to a plasma processing apparatus. The apparatus includes a plasma chamber. The apparatus includes a processing chamber separated from the plasma chamber. The processing chamber includes a substrate holder operable to support a workpiece. The apparatus includes a plasma source configured to generate a plasma in the plasma chamber. The apparatus includes a separation grid separating the plasma chamber from the processing chamber. The separation grid can be configured to filter one or more ions generated in the plasma and allow the passage of neutral particles from the plasma chamber to the processing chamber. The apparatus can include at least one gas port configured to inject a gas into neutral particles passing through the separation grid.

Other examples aspects of the present disclosure are directed to apparatus, methods, processes, separation grids, and devices for plasma processing using post plasma gas injection.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
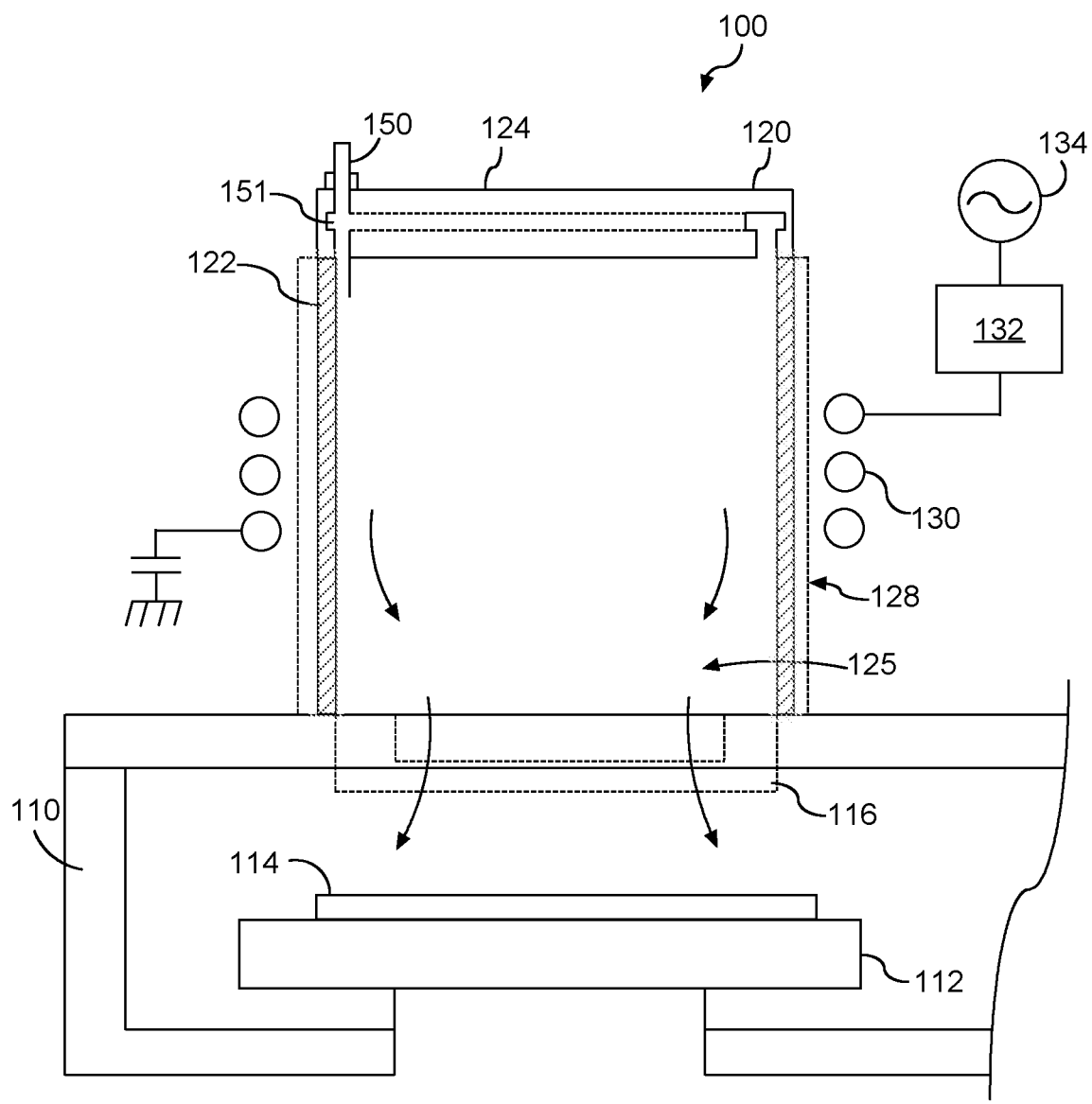
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed plasma processing apparatus (e.g., a plasma strip tool) and associated methods for surface treatment of semiconductor substrates, such as a semiconductor wafer. A plasma processing apparatus can include a plasma chamber where a plasma is generated using a plasma source, such as an inductively coupled plasma source. The plasma processing apparatus can include a processing chamber. The processing chamber can include a substrate holder (e.g., a pedestal) to support a workpiece. The plasma chamber and processing chamber can be separated by a separation grid.

The separation grid can include one or more grid plates. Each grid plate can include a pattern of holes. The separation grid can filter one or more ions generated in the plasma. The separation grid can allow the passage of neutral particles generated in the plasma through the separation grid to the processing chamber. The neutral particles can be used, for instance, to remove a material (e.g., photoresist) from the workpiece.

According to example aspects of the present disclosure, the plasma processing apparatus can include one or more gas ports to inject a gas into the neutral particles flowing through the separation grid. For instance, a gas port can be operable to inject a gas (e.g., a cooling gas) between grid plates in a multi-plate separation grid. In this way, the separation grid can provide for post plasma gas injection into the neutral particles.

The post plasma gas injection can provide a number of technical effects and benefits. For example, the gas can be injected, for example, to control uniformity characteristics of a surface treatment process. For example, a neutral gas (e.g., inert gas) can be injected to control uniformity, such as uniformity in a radial direction with respect to the workpiece. Cooling gas can be injected to control the energy of radicals passing through the separation grid.

In some embodiments, a first gas port can be used to inject a gas into a first portion of the separation grid (e.g., a peripheral portion of the separation grid). A second gas port can be used to inject a gas into a second portion of the separation grid (e.g., a center portion of the separation grid). The flow of gas through the first gas ports and the second gas ports can be independently controlled to affect process uniformity. For instance, a cooling neutral gas can be provided via the first gas port. This can tune the energy of radicals passing through the center portion of the separation grid relative to the radicals relative to the remainder of the separation grid. In this way, process uniformity in a radial direction of a workpiece can be controlled using post-plasma gas injection.

One example embodiment of the present disclosure is directed to a plasma processing apparatus can include a plasma chamber. The processing chamber can be separated from the plasma chamber. The processing chamber can include a substrate holder operable to support a substrate. The apparatus can include a plasma source configured to generate a plasma in the plasma chamber. The apparatus can include a separation grid separating the plasma chamber and the processing chamber. The separation grid can be configured to filter one or more ions generated in the plasma and to allow the passage of neutral particles from the plasma chamber to the processing chamber. The apparatus can include at least one gas port configured to inject a gas into neutral particles passing through the separation grid.

In some embodiments, the at least one gas port includes a first gas port operable to inject a gas into neutral particles at a first portion of the separation grid and a second gas port operable to inject a gas into neutral particles at a second portion of the separation grid. The first portion can be a peripheral portion of the separation grid and the second portion can be a center portion of the separation grid.

In some embodiments, the separation grid can include a first grid plate and a second grid plate disposed in spaced parallel relationship. The gas port can be configured to inject a gas between the first grid plate and the second grid plate. In some embodiments, the separation grid can include a third grid plate disposed in spaced parallel relationship with the first grid plate and the second grid plate. The gas port can be configured to inject a gas between the second grid plate and the third grid plate. In some embodiments, the at least one gas port comprises a first gas port configured to inject a gas between the first grid plate and the second grid plate and a second gas port configured to inject a gas between the second grid plate and the third grid plate.

In some embodiments, one or more of the first grid plate and/or the second grid plate can be electrically conductive. In some embodiments, the first grid plate and/or the second grid plate can be grounded. In some embodiments, the plasma source can include an inductive coil that when energized with RF energy generates a plasma in a process gas in the plasma chamber.

Another example embodiment of the present disclosure is directed to a separation grid for a plasma processing apparatus. The separation grid can include a first grid plate. The first grid plate can have a plurality of holes arranged in a first pattern. The separation grid can include a second grid plate disposed in spaced parallel relation with the first grid plate. The second grid plate can have a plurality of holes arranged in a second pattern. At least one gas port configured to inject a gas into the separation grid.

In some embodiments, the at least one gas port includes a first gas port operable to inject a gas into neutral particles at a first portion of the separation grid and a second gas port operable to inject a gas into neutral particles at a second portion of the separation grid. The first portion can be a peripheral portion of the separation grid and the second portion can be a center portion of the separation grid.

In some embodiments, the at least on gas port can be configured to inject a gas between the first grid plate and the second grid plate. In some embodiments, one or more of the first grid plate and the second grid plate are electrically conductive. In some embodiments, the first pattern can be different from the second pattern.

In some embodiments, the separation grid can further include a third grid plate disposed in spaced parallel relationship with the second grid plate. The at least one gas port can be configured to inject a gas between the second grid plate and the third grid plate. In some embodiments, the at least one gas port includes a first gas port configured to inject a gas between the first grid plate and the second grid plate and a second gas port configured to inject a gas between the second grid plate and the third grid plate.

Another example embodiment of the present disclosure is directed to a method for processing a workpiece in a plasma processing apparatus. The method can include dissociating one or more molecules into one or more ions and one or more neutral particles in a mixture using a plasma generated in a plasma chamber of a plasma processing apparatus. The method can include filtering the one or more ions generated by the plasma in the mixture using a separation grid disposed between the plasma chamber and a processing chamber of the plasma processing apparatus. The processing chamber can be separated from the plasma chamber by the separation grid. The method can include passing the one or more neutral particles generated in the plasma through the separation grid. The method can include injecting a gas into the neutral particles at the separation grid. The method can include exposing the workpiece to the neutral particles in the processing chamber.

In some embodiments, the gas can be an inert gas. In some embodiments, the gas can be a cooling gas.

In some embodiments, the separation grid can include a first grid plate and a second grid plate. Injecting the gas into the neutral particles at the separation grid can include injecting a gas between the first grid plate and the second grid plate.

In some embodiments, the separation grid can include a third grid plate. In some embodiments, injecting the gas into the neutral particles at the separation grid can include injecting a gas between the second grid plate and the third grid plate. In some embodiments, injecting the gas into the neutral particles at the separation grid can include injecting a gas between the first grid plate and the second grid plate and injecting a gas between the second grid plate and the third grid plate.

In some embodiments, injecting the gas into the neutral particles includes injecting a gas into neutral particles at a first portion of the separation grid and a injecting a gas into neutral particles at a second portion of the separation grid.

Example aspects of the present disclosure are discussed with reference to treating a semiconductor wafer for purposes of illustration and discussion. Those of ordinary skill in the art, using the disclosures provided herein, will understand that aspects of the present disclosure can be used in conjunction with the processing of other workpieces without deviating from the scope of the present disclosure. As used herein, the use of the term "about" in conjunction with a numerical value can refer to within 20% of the stated numerical value.

With reference now to the FIGS., example embodiments of the present disclosure will now be set forth. FIG. 1 depicts an example plasma processing apparatus 100. The plasma processing apparatus 100 includes a processing chamber 110 and a plasma chamber 120 that is separate from the processing chamber 110. The processing chamber 110 includes a substrate holder or pedestal 112 operable to hold a substrate 114. An inductive plasma can be generated in plasma chamber 120 (i.e., plasma generation region) and desired particles (e.g., neutral particles) are then channeled from the plasma chamber 120 to the surface of substrate 114 through holes provided in a separation grid 116 that separates the plasma chamber 120 from the processing chamber 110 (e.g., downstream region).

The plasma chamber 120 includes a dielectric side wall 122. The plasma chamber 120 includes a top plate 124. The dielectric side wall 122 and ceiling 124 define a plasma chamber interior 125. Dielectric side wall 122 can be formed from any dielectric material, such as quartz. An induction coil 130 can be disposed adjacent the dielectric side wall 122 about the plasma chamber 120. The induction coil 130 can be coupled to an RF power generator 134 through a suitable matching network 132. Reactant and carrier gases can be provided to the chamber interior from gas supply 150. When the induction coil 130 is energized with RF power from the RF power generator 134, a substantially inductive plasma is induced in the plasma chamber 120. In a particular embodiment, the plasma processing apparatus 100 can include a grounded Faraday shield 128 to reduce capacitive coupling of the induction coil 130 to the plasma.

As shown in FIG. 1, a separation grid 116 separates the plasma chamber 120 from the processing chamber 110. The separation grid 116 can be used to perform ion filtering from a of particles generated by plasma in the plasma chamber 120. Particles passing through the separation grid 116 can be exposed to the workpiece 114 (e.g. a semiconductor wafer) in the processing chamber for surface treatment of the workpiece (e.g., photoresist removal).

More particularly, in some embodiments, the separation grid 116 can be transparent to neutral species but not transparent to charged particles from the plasma. For example, charged particles or ions can recombine on walls of the separation grid 116. The separation grid 116 can include one or more grid plates of material with holes distributed according to a hole pattern for each sheet of material. The hole patterns can be the same or different for each grid plate.

For example, the holes can be distributed according to a plurality of hole patterns on a plurality of grid plates arranged in a substantially parallel configuration such that no hole allows for a direct line of sight between the plasma chamber and the processing chamber to, for example, reduce or block UV light. Depending on the process, some or all of the grid can be made of a conductive material (e.g., Al, Si, SiC, etc.) and/or non-conductive material (e.g., quartz, etc.). In some embodiments, if a portion of the grid (e.g. a grid plate) is made of a conductive material, the portion of the grid can be grounded.

Figure 2:
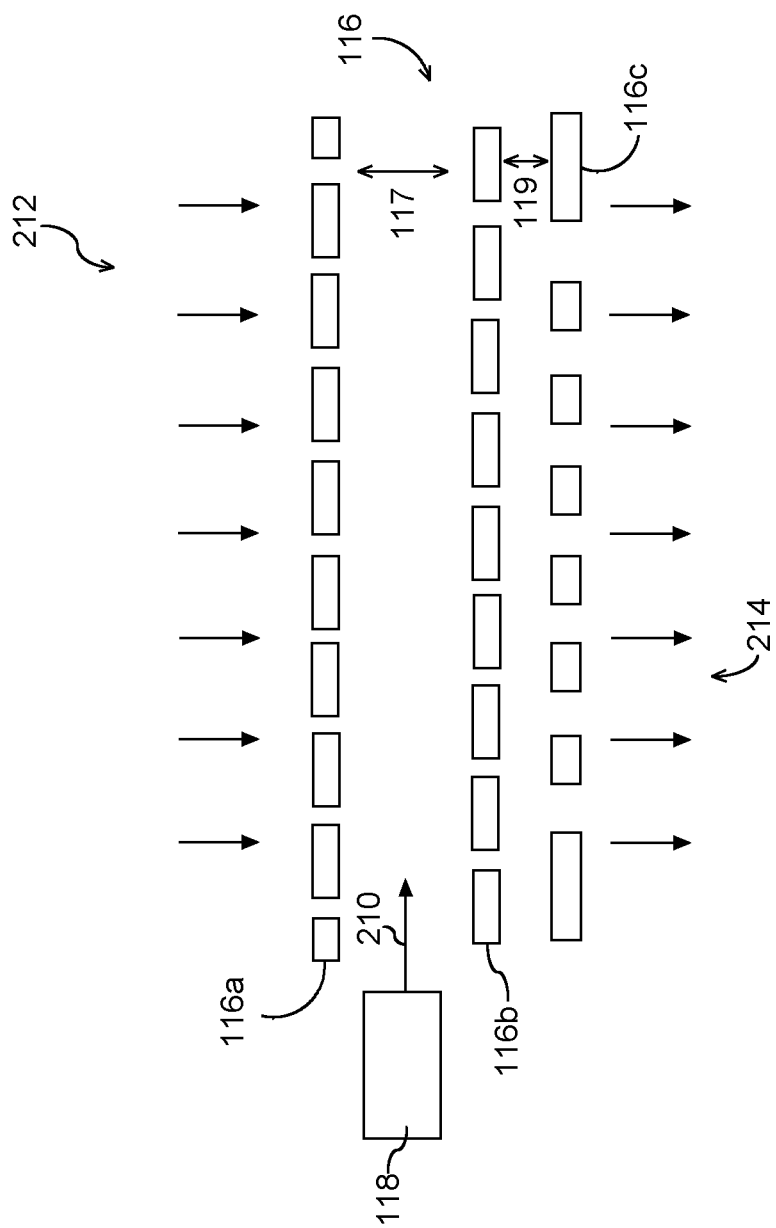
FIG. 2 depicts example post plasma gas injection at a separation grid according to example embodiments of the present disclosure.
Figure 3:
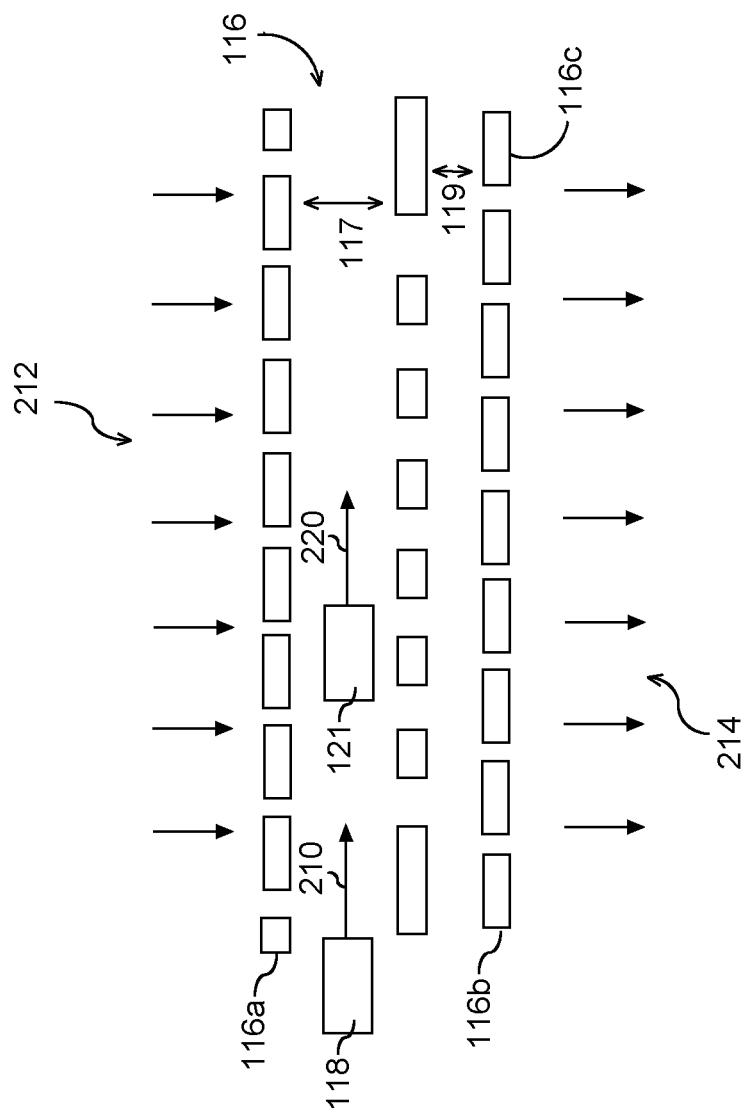
FIG. 3 depicts example post plasma gas injection at a separation grid according to example embodiments of the present disclosure.
Figure 4:
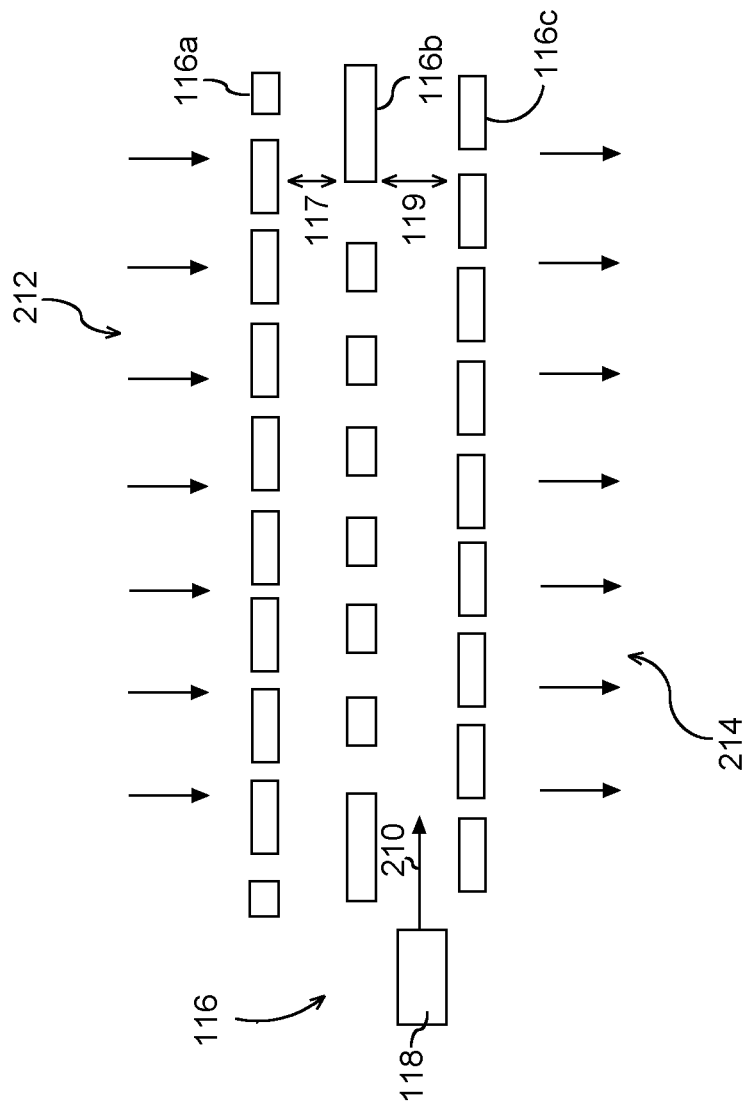
FIG. 4 depicts example post plasma gas injection at a separation grid according to example embodiments of the present disclosure.

As shown in FIGS. 2, 3, and 4, the separation grid 116 can be a multi-plate separation grid (e.g., a dual-plate grid, a three-plate grid, a four-plate grid, etc.). Example embodiments are illustrated herein with reference to a three-plate separation grid for the purposes of illustration and discussion of the embodiments. One skilled in the art will understand that the teachings discussed herein are equally applicable to dual-plate grids, four-plate grids, five-plate grids, six-plate grids, or grids having any other suitable number of plates or layers.

FIG. 2 depicts example post plasma gas injection at a separation grid 116 according to example embodiments of the present disclosure. The separation grid 116 can include multiple grid plates 116a, 116b, and 116c arranged in spaced parallel relationship for ion/UV filtering. For instance, the separation grid 116 can include a first grid plate 116a and a second grid plate 116b that are spaced apart in parallel relationship to one another. The first grid plate 116a and the second grid plate 116b can be separated by a first distance 117.

The separation grid 116 can include a third grid plate 116c that is spaced apart in parallel relationship with first grid plate 116a and/or second grid plate 116b. The second grid plate 116b and the third grid plate 116c can be separated by a second distance 119. The second distance 119 can be the same as the first distance 117 and/or different from the first distance 117.

The size of the holes and thickness of each grid plate 116a, 116b, 116c can affect transparency for both charged and neutral particles. For instance, charged particles (e.g., ions) can recombine on the walls in their path through the holes of each grid plate 116a, 116b, 116c in the separation grid 116. Neutral species (e.g., radicals) can flow relatively freely through the holes in the separation grid 116.

In some embodiments, the grid plates 116a, 116b, 116c can be made of metal (e.g., aluminum) or other electrically conductive material and/or the grid plates 116a, 116b, 116c can be made from either an electrically conductive material or dielectric material (e.g., quartz, ceramic, etc.). In some embodiments, the grid plates 116a, 116b, 116c can be made of other materials, such as silicon or silicon carbide. In the event a grid plate 116a, 116b, 116c is made of metal or other electrically conductive material, the grid plate 116a, 116b, 116c can be grounded.

As shown in FIG. 2, the plasma processing apparatus can include a gas port 118 configured to inject a gas 210 between the grid plate 116a and the grid plate 116b, such as in channel formed between grid plate 116a and 116b. More particularly, a mixture of ions and neutral particles 212 generated in the plasma can be exposed to grid plate 116a. The gas port 118 can inject a gas 210 or other substance into neutral particles flowing through the grid plate 116a. Neutral particles 214 passing through the separation grid 116 can be exposed to a workpiece.

The gas 210 or other substance from the gas port 118 can be at a higher or lower temperature than the radicals coming from the plasma chamber 120 or can be the same temperature as the radicals from the plasma chamber 120. The gas can be used to adjust or correct uniformity, such as radial uniformity, within the plasma processing apparatus 100, by controlling the energy of the radicals passing through the separation grid. In some embodiments, the gas 210 can be an inert gas, such as helium, nitrogen, and argon.

FIG. 3 depicts post plasma gas injection a separation grid 116 similar to that illustrated in FIG. 2. In FIG. 3, however, post plasma gas injection is divided into multiple zones, such as a center zone and a peripheral zone. Gas injection can be independently controlled for each of the zones to affect process uniformity during a surface treatment process.

More particularly, the separation grid 116 includes a first port gas port 118 operable to inject a gas 210 into a first portion (e.g., peripheral portion) of the separation grid 116 between grid plate 116a and grid plate 116b. The separation grid 116 includes a second gas port 121 operable to inject a gas 220 or other substance into a second portion (e.g., center portion) of the separation grid between grid plate 116a and grid plate 116b. Parameters associated with gas 210 from gas port 118 and gas 220 from gas port 121 (e.g., flow rate, chemical composition, temperature, pressure, mixture, etc.) can be independently controlled to affect process uniformity of a surface treatment process.

For instance, the first gas 210 can be the same as or different from the second gas 220. The first gas 210 can have the same temperature or a different temperature relative to the second gas 220. The first gas 210 can have the same flow rate or a different flow rate relative to the second gas 220. The first gas 210 can have the same chemical makeup or a different chemical makeup relative to the second gas 220, etc. In some embodiments, the gas 210 and/or gas 220 can be an inert gas, such as helium, nitrogen, and argon.

FIG. 4 depicts example post plasma gas injection at a separation grid 116 according to example embodiments of the present disclosure. The separation grid 116 can include multiple grid plates 116a, 116b, and 116c arranged in spaced parallel relationship for ion/UV filtering. For instance, the separation grid 116 can include a first grid plate 116a and a second grid plate 116b that are spaced apart in parallel relationship to one another. The first grid plate 116a and the second grid plate 116b can be separated by a first distance 117.

The separation grid 116 can include a third grid plate 116c that is spaced apart in parallel relationship with first grid plate 116a and/or second grid plate 116b. The second grid plate 116b and the third grid plate 116c can be separated by a second distance 119. The second distance 119 can be the same as the first distance 117 and/or different from the first distance 117.

The size of the holes and thickness of each grid plate 116a, 116b, 116c can affect transparency for both charged and neutral particles. For instance, charged particles (e.g., ions) can recombine on the walls in their path through the holes of each grid plate 116a, 116b, 116c in the separation grid 116. Neutral species (e.g., radicals) can flow relatively freely through the holes in the separation grid 116.

In some embodiments, the grid plates 116a, 116b, 116c can be made of metal (e.g., aluminum) or other electrically conductive material and/or the grid plates 116a, 116b, 116c can be made from either an electrically conductive material or dielectric material (e.g., quartz, ceramic, etc.). In some embodiments, the grid plates 116a, 116b, 116c can be made of other materials, such as silicon or silicon carbide. In the event a grid plate 116a, 116b, 116c is made of metal or other electrically conductive material, the grid plate 116a, 116b, 116c can be grounded.

As shown in FIG. 4, the plasma processing apparatus can include a gas port 118 configured to inject a gas 210 between the grid plate 116b and the grid plate 116c, such as in channel formed between grid plate 116b and 116c. More particularly, a mixture of ions and neutral particles 212 generated in the plasma can be exposed to grid plate 116a. The gas port 118 can inject a gas 210 or other substance into neutral particles flowing through the grid plates 116a and 116b. Neutral particles 214 passing through the separation grid 116 can be exposed to a workpiece.

The gas 210 or other substance from the gas port 118 can be at a higher or lower temperature than the radicals coming from the plasma chamber 120 or can be the same temperature as the radicals from the plasma chamber 120. The gas can be used to adjust or correct uniformity, such as radial uniformity, within the plasma processing apparatus 100, by controlling the energy of the radicals passing through the separation grid. In some embodiments, the gas 210 can be an inert gas, such as helium, nitrogen, and argon.

Figure 5:
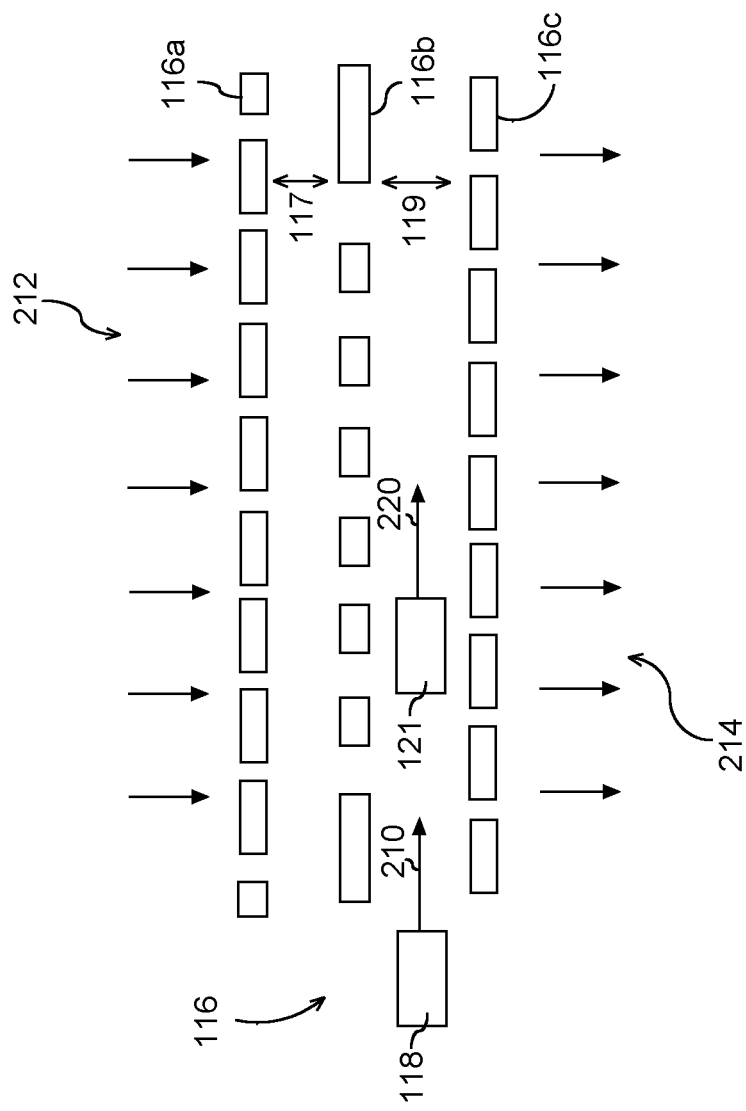
FIG. 5 depicts example post plasma gas injection at a separation grid according to example embodiments of the present disclosure.

FIG. 5 depicts post plasma gas injection a separation grid 116 similar to that illustrated in FIG. 4. In FIG. 5, however, post plasma gas injection is divided into multiple zones, such as a center zone and a peripheral zone. Gas injection can be independently controlled for each of the zones to affect process uniformity during a surface treatment process.

More particularly, the separation grid 116 includes a first port gas port 118 operable to inject a gas 210 into a first portion (e.g., peripheral portion) of the separation grid 116 between grid plate 116b and grid plate 116c. The separation grid 116 includes a second gas port 121 operable to inject a gas 220 or other substance into a second portion (e.g., center portion) of the separation grid between grid plate 116b and grid plate 116c. Parameters associated with gas 210 from gas port 118 and gas 220 from gas port 121 (e.g., flow rate, chemical composition, temperature, pressure, mixture, etc.) can be independently controlled to affect process uniformity of a surface treatment process.

For instance, the first gas 210 can be the same as or different from the second gas 220. The first gas 210 can have the same temperature or a different temperature relative to the second gas 220. The first gas 210 can have the same flow rate or a different flow rate relative to the second gas 220. The first gas 210 can have the same chemical makeup or a different chemical makeup relative to the second gas 220, etc. In some embodiments, the gas 210 and/or gas 220 can be an inert gas, such as helium, nitrogen, and argon.

Figure 6:
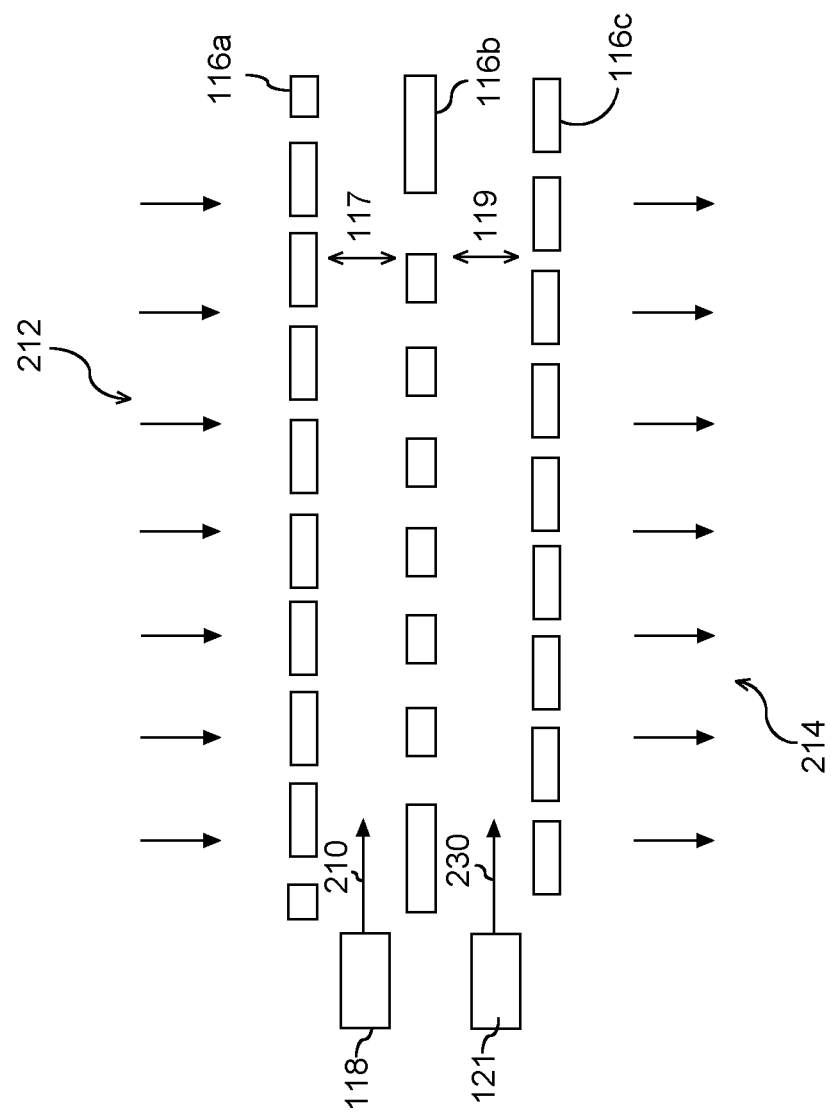
FIG. 6 depicts example post plasma gas injection at a separation grid according to example embodiments of the present disclosure.

FIG. 6 depicts example post plasma gas injection at a separation grid 116 according to example embodiments of the present disclosure. The separation grid 116 can include multiple grid plates 116a, 116b, and 116c arranged in spaced parallel relationship for ion/UV filtering. For instance, the separation grid 116 can include a first grid plate 116a and a second grid plate 116b that are spaced apart in parallel relationship to one another. The first grid plate 116a and the second grid plate 116b can be separated by a first distance 117.

The separation grid 116 can include a third grid plate 116c that is spaced apart in parallel relationship with first grid plate 116a and/or second grid plate 116b. The second grid plate 116b and the third grid plate 116c can be separated by a second distance 119. The second distance 119 can be the same as the first distance 117 and/or different from the first distance 117.

The size of the holes and thickness of each grid plate 116a, 116b, 116c can affect transparency for both charged and neutral particles. For instance, charged particles (e.g., ions) can recombine on the walls in their path through the holes of each grid plate 116a, 116b, 116c in the separation grid 116. Neutral species (e.g., radicals) can flow relatively freely through the holes in the separation grid 116.

In some embodiments, the grid plates 116a, 116b, 116c can be made of metal (e.g., aluminum) or other electrically conductive material and/or the grid plates 116a, 116b, 116c can be made from either an electrically conductive material or dielectric material (e.g., quartz, ceramic, etc.). In some embodiments, the grid plates 116a, 116b, 116c can be made of other materials, such as silicon or silicon carbide. In the event a grid plate 116a, 116b, 116c is made of metal or other electrically conductive material, the grid plate 116a, 116b, 116c can be grounded.

As shown in FIG. 6, the plasma processing apparatus can include a gas port 118 configured to inject a gas 210 between the grid plate 116a and the grid plate 116b, such as in channel formed between grid plate 116a and 116b. In addition, the plasma processing apparatus can include a gas port 121 configured to inject a gas 230 between the grid plate 116b and the grid plate 116b, such as in channel formed between grid plate 116b and 116c.

The gas 210 or other substance from the gas port 118 can be at a higher or lower temperature than the radicals coming from the plasma chamber 120 or can be the same temperature as the radicals from the plasma chamber 120. The gas 210 can be used to adjust or correct uniformity, such as radial uniformity, within the plasma processing apparatus 100, by controlling the energy of the radicals passing through the separation grid. In some embodiments, the gas 210 can be an inert gas, such as helium, nitrogen, and argon.

The gas 230 or other substance from the gas port 121 can be at a higher or lower temperature than the radicals coming from the plasma chamber 120 or can be the same temperature as the radicals from the plasma chamber 120. The gas 230 can be used to adjust or correct uniformity, such as radial uniformity, within the plasma processing apparatus 100, by controlling the energy of the radicals passing through the separation grid. In some embodiments, the gas 230 can be an inert gas, such as helium, nitrogen, and argon.

For instance, the gas 210 can be the same as or different from the gas 230. The gas 210 can have the same temperature or a different temperature relative to the gas 230. The gas 210 can have the same flow rate or a different flow rate relative to the gas 220. The gas 210 can have the same chemical makeup or a different chemical makeup relative to the gas 220, etc.

Figure 7:
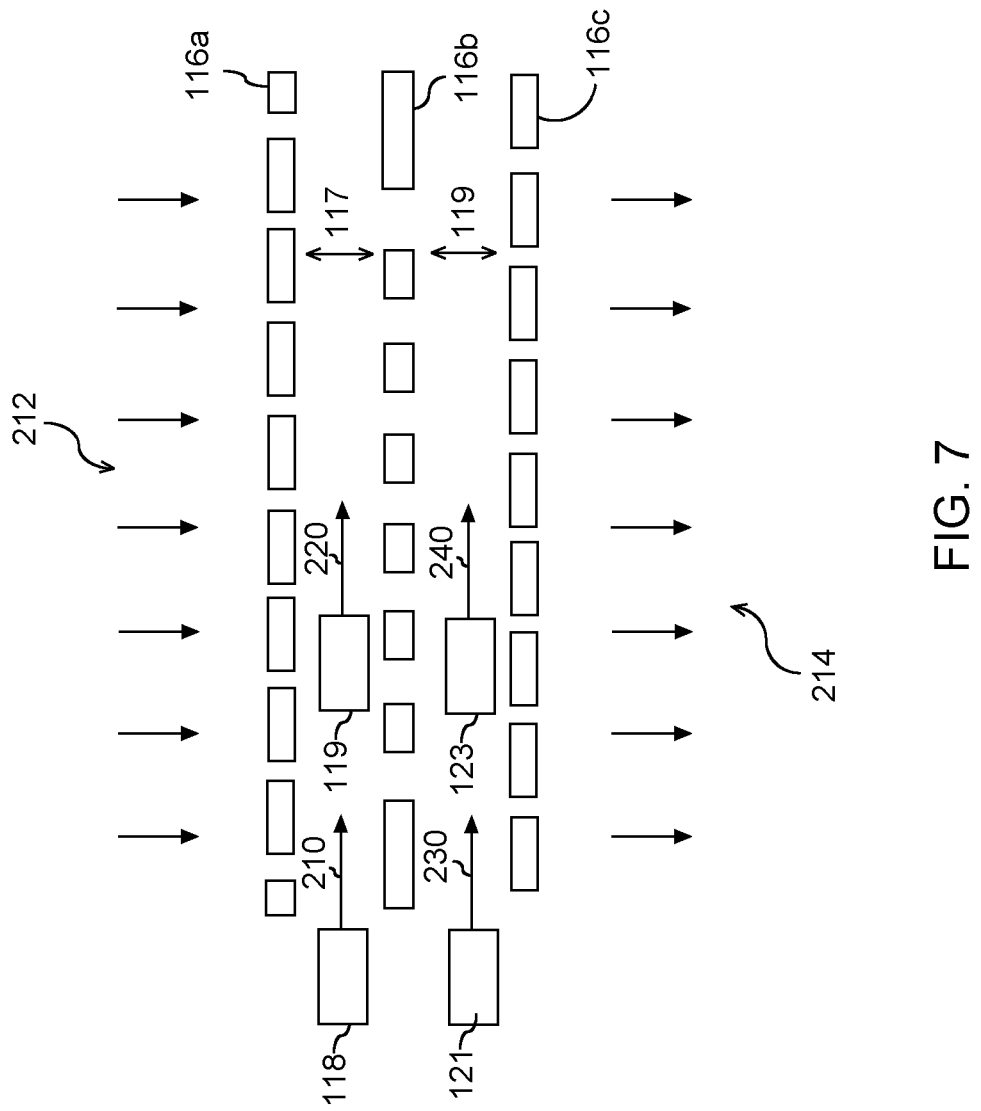
FIG. 7 depicts example post plasma gas injection at a separation grid according to example embodiments of the present disclosure.

FIG. 7 depicts post plasma gas injection a separation grid 116 similar to that illustrated in FIG. 7. In FIG. 7, however, post plasma gas injection is divided into multiple zones, such as a center zone and a peripheral zone. Gas injection can be independently controlled for each of the zones to affect process uniformity during a surface treatment process.

More particularly, the separation grid 116 includes a first port gas port 118 operable to inject a gas 210 into a first portion (e.g., peripheral portion) of the separation grid 116 between grid plate 116a and grid plate 116b. The separation grid 116 includes a second gas port 121 operable to inject a gas 220 or other substance into a first portion (e.g., peripheral portion) of the separation grid between grid plate 116b and grid plate 116c. The separation grid 116 includes a third port gas port 119 operable to inject a gas 220 into a second portion (e.g., center portion) of the separation grid 116 between grid plate 116a and grid plate 116b. The separation grid 116 includes a fourth gas port 123 operable to inject a gas 240 or other substance into a second portion (e.g., center portion) of the separation grid between grid plate 116b and grid plate 116c. Parameters associated with gas 210 from gas port 118, gas 230 from gas port 121, gas 220 from gas port 119, and/or gas 240 from gas port 123 (e.g., flow rate, chemical composition, temperature, pressure, mixture, etc.) can be independently controlled to affect process uniformity of a surface treatment process.

For instance, the gases 210, 220, 230, and 240 can be the same or different the gases 210, 220, 230, and 240 can have the same temperature or a different temperature. The gases 210, 220, 230, and 240 can have the same flow rate or a different flow rate. The gases 210, 220, 230, and 240 have the same chemical makeup or a different chemical makeup, etc. In some embodiments, the gases 210, 220, 230 and/or 240 can be an inert gas, such as helium, nitrogen, and argon.

Figure 8:
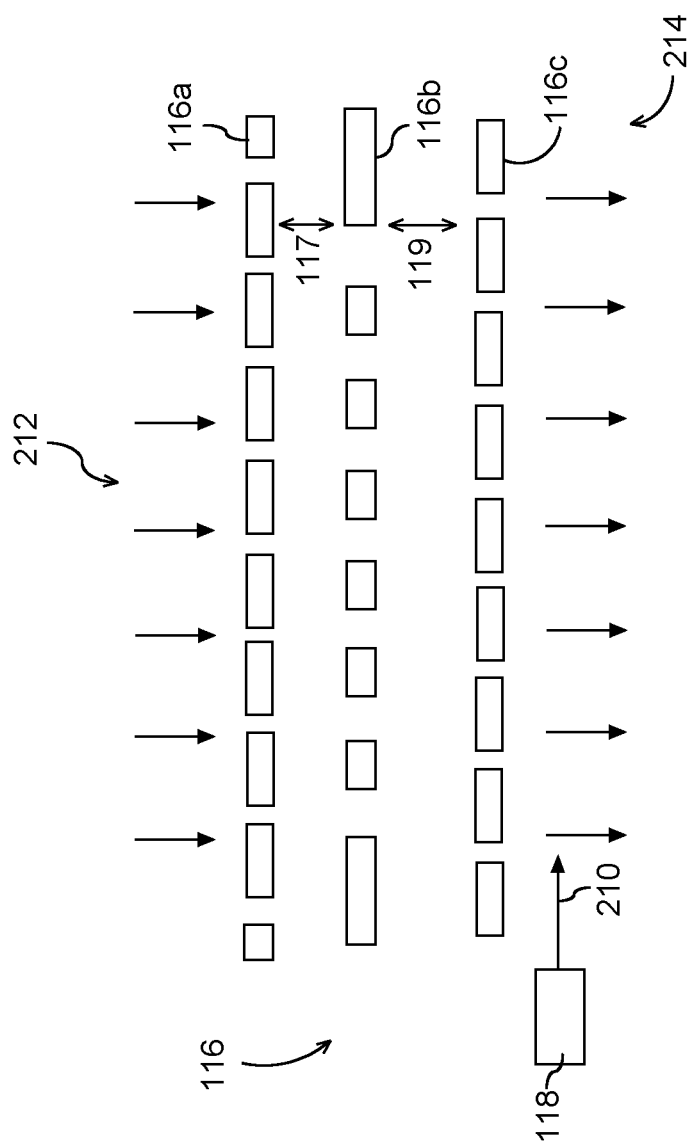
FIG. 8 depicts example post plasma gas injection at a separation grid according to example embodiments of the present disclosure.

FIG. 8 depicts example post plasma gas injection at a separation grid 116 according to example embodiments of the present disclosure. The separation grid 116 can include multiple grid plates 116a, 116b, and 116c arranged in spaced parallel relationship for ion/UV filtering. For instance, the separation grid 116 can include a first grid plate 116a and a second grid plate 116b that are spaced apart in parallel relationship to one another. The first grid plate 116a and the second grid plate 116b can be separated by a first distance 117.

The separation grid 116 can include a third grid plate 116c that is spaced apart in parallel relationship with first grid plate 116a and/or second grid plate 116b. The second grid plate 116b and the third grid plate 116c can be separated by a second distance 119. The second distance 119 can be the same as the first distance 117 and/or different from the first distance 117.

The size of the holes and thickness of each grid plate 116a, 116b, 116c can affect transparency for both charged and neutral particles. For instance, charged particles (e.g., ions) can recombine on the walls in their path through the holes of each grid plate 116a, 116b, 116c in the separation grid 116. Neutral species (e.g., radicals) can flow relatively freely through the holes in the separation grid 116.

In some embodiments, the grid plates 116a, 116b, 116c can be made of metal (e.g., aluminum) or other electrically conductive material and/or the grid plates 116*a*, 116*b*, 116*c* can be made from either an electrically conductive material or dielectric material (e.g., quartz, ceramic, etc.). In some embodiments, the grid plates 116*a*, 116*b*, 116*c* can be made of other materials, such as silicon or silicon carbide. In the event a grid plate 116*a*, 116*b*, 116*c* is made of metal or other electrically conductive material, the grid plate 116*a*, 116*b*, 116*c* can be grounded.

As shown in FIG. 8, the plasma processing apparatus can include a gas port 118 configured to inject a gas 210 beneath the grid plate 116*c*. The gas can be injected into neutral particles 214 passing through the separation grid 116 for exposure to a workpiece.

The gas 210 or other substance from the gas port 118 can be at a higher or lower temperature than the radicals coming from the plasma chamber 120 or can be the same temperature as the radicals from the plasma chamber 120. The gas can be used to adjust or correct uniformity, such as radial uniformity, within the plasma processing apparatus 100, by controlling the energy of the radicals passing through the separation grid. In some embodiments, the gas 210 can be an inert gas, such as helium, nitrogen, and argon.

Figure 9:
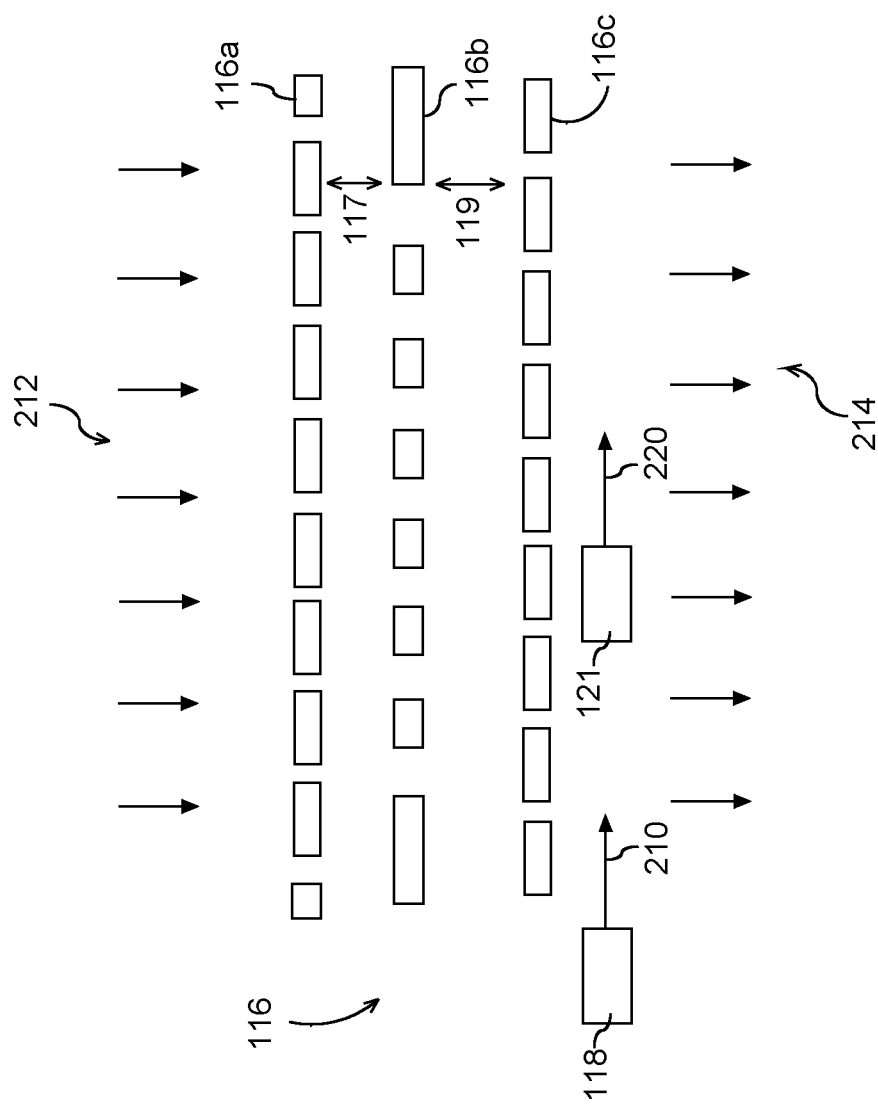
FIG. 9 depicts example post plasma gas injection at a separation grid according to example embodiments of the present disclosure.

FIG. 9 depicts post plasma gas injection a separation grid 116 similar to that illustrated in FIG. 8. In FIG. 9, however, post plasma gas injection is divided into multiple zones, such as a center zone and a peripheral zone. Gas injection can be independently controlled for each of the zones to affect process uniformity during a surface treatment process.

More particularly, the separation grid 116 includes a first port gas port 118 operable to inject a gas 210 into a first portion (e.g., peripheral portion) of the separation grid 116 beneath grid plate 116*c*. The separation grid 116 includes a second gas port 121 operable to inject a gas 220 or other substance into a second portion (e.g., center portion) of the separation grid beneath grid plate 116*c*. Parameters associated with gas 210 from gas port 118 and gas 220 from gas port 121 (e.g., flow rate, chemical composition, temperature, pressure, mixture, etc.) can be independently controlled to affect process uniformity of a surface treatment process.

For instance, the first gas 210 can be the same as or different from the second gas 220. The first gas 210 can have the same temperature or a different temperature relative to the second gas 220. The first gas 210 can have the same flow rate or a different flow rate relative to the second gas 220. The first gas 210 can have the same chemical makeup or a different chemical makeup relative to the second gas 220, etc. In some embodiments, the gas 210 and/or gas 220 can be an inert gas, such as helium, nitrogen, and argon.

Additional grid plates can be used in a separation grid without deviating from the scope of the present disclosure. For instance, in some embodiments, a fourth grid plate can be located below the third grid plate 116*c* of FIG. 2, 3, 4, 5, 6, 7, 8, or 9. A gas port 118 may be located between the first grid plate 116*a* and second grid plate 116*b*, the second grid plate 116*b* and third grid plate 116*c*, and/or the third grid plate 116*c* and fourth grid plate.

FIGS. 2, 3, 4, 5, 6, 7, 8, and 9 illustrate gas being injected in a horizontal direction for purposes of illustration and discussion. Those of ordinary skill in the art, using the disclosure provided herein, will understand that gas can be injected at the separation grid in any direction (e.g., horizontal, vertical, at an angle, oblique, etc.) without deviating from the scope of the present disclosure.

Figure 10:
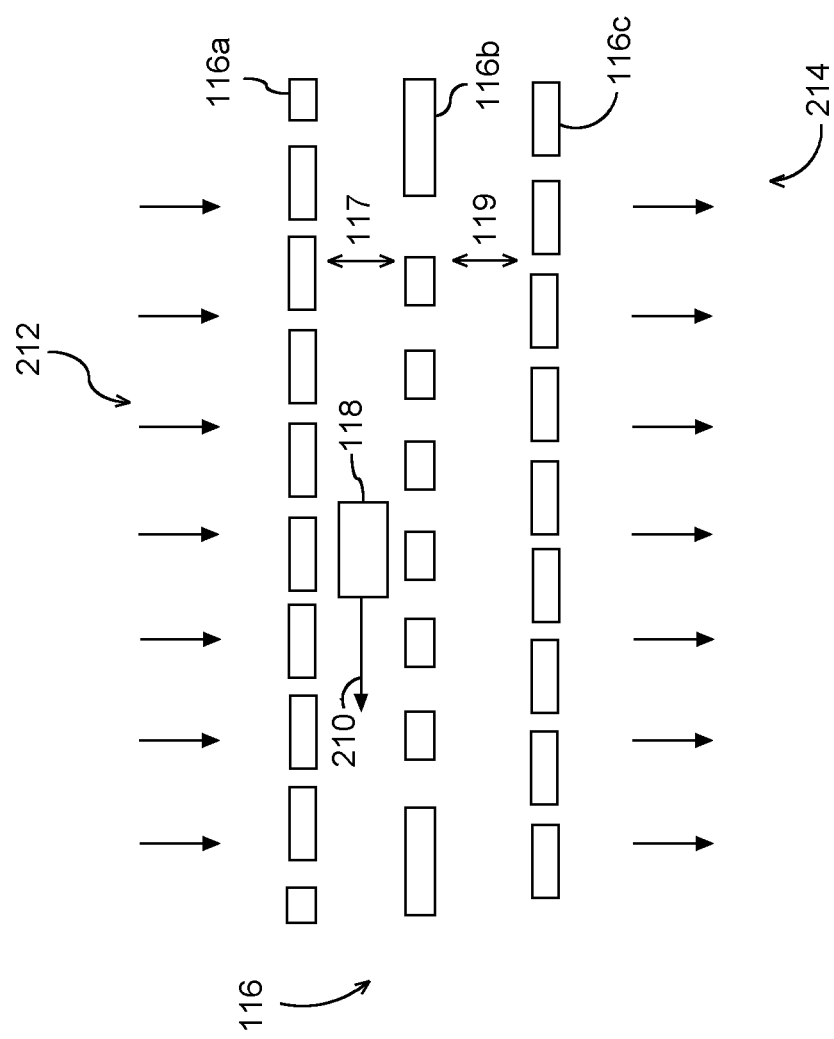
FIG. 10 depicts example post plasma gas injection at a separation grid according to example embodiments of the present disclosure.

For instance, FIG. 10 depicts a separation grid 116 similar to that illustrated with respect to FIGS. 2-9. The separation grid has a gas port 118 operable to inject gas 210 between a first grid plate 116*a* and a second grid plate 116*b*. As shown, the gas port 118 is configured to inject gas in a horizontal direction towards a peripheral portion of the separation grid 116.

Figure 11:
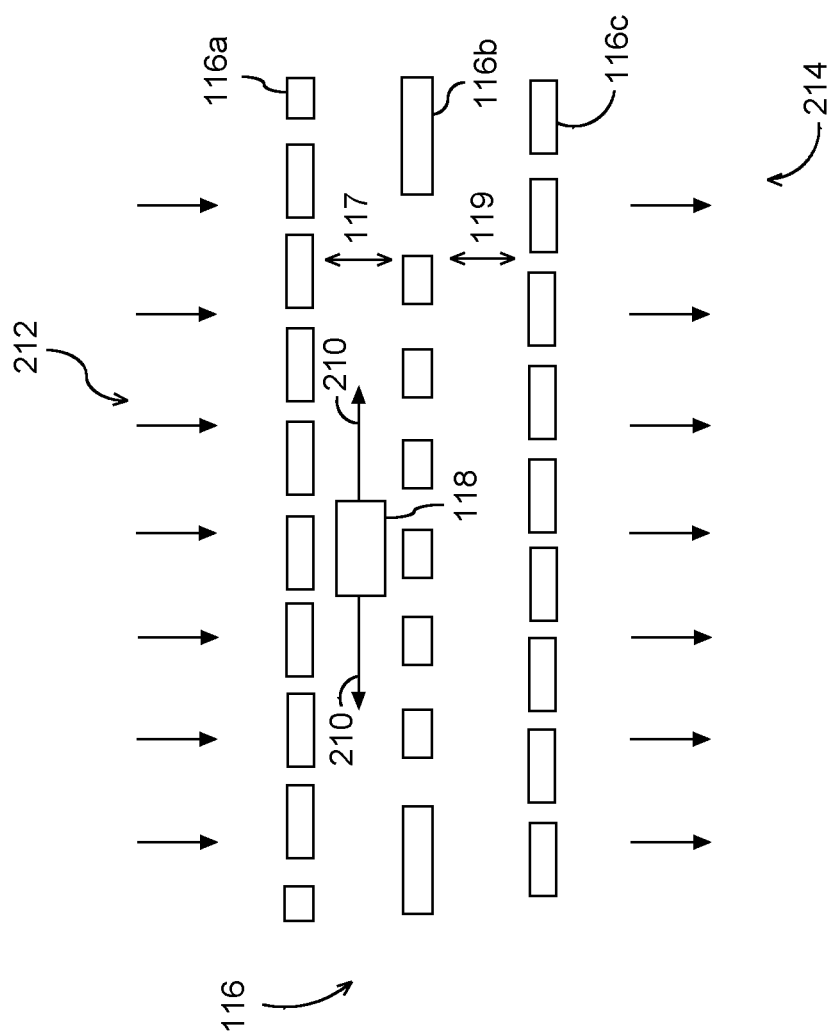
FIG. 11 depicts example post plasma gas injection at a separation grid according to example embodiments of the present disclosure.

FIG. 11 depicts a separation grid 116 similar to that illustrated with respect to FIGS. 2-10. The separation grid 116 has a gas port 118 operable to inject gas 210 between a first grid plate 116*a* and a second grid plate 116*b*. As shown, the gas port 118 is configured to inject gas 210 in a horizontal direction towards a center portion of the separation grid 116 and to inject gas 210 in a horizontal direction towards a center portion of the separation grid 116.

Figure 12:
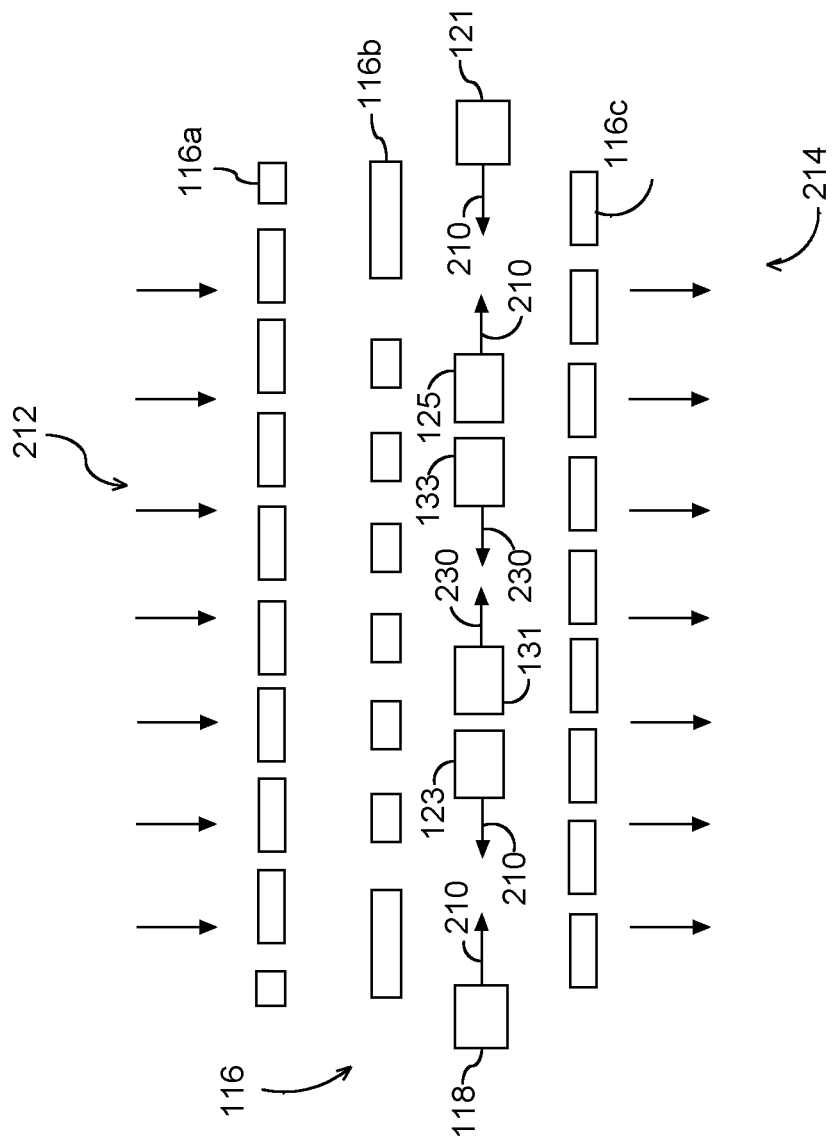
FIG. 12 depicts example post plasma gas injection at a separation grid according to example embodiments of the present disclosure.

FIG. 12 depicts a separation grid 116 similar to that illustrated with respect to FIGS. 2-11. The separation grid 116 has gas ports 118, 121, 123, and 125 configured to inject gas 210 in a peripheral portion of the separation grid 116. The separation grid 116 has gas ports 131 and 133 configured to inject gas 230 in a center portion of the separation grid 116. As discussed above, the gas 210 can have different parameters relative to gas 230 that can be controlled to affect process uniformity.

Figure 13:
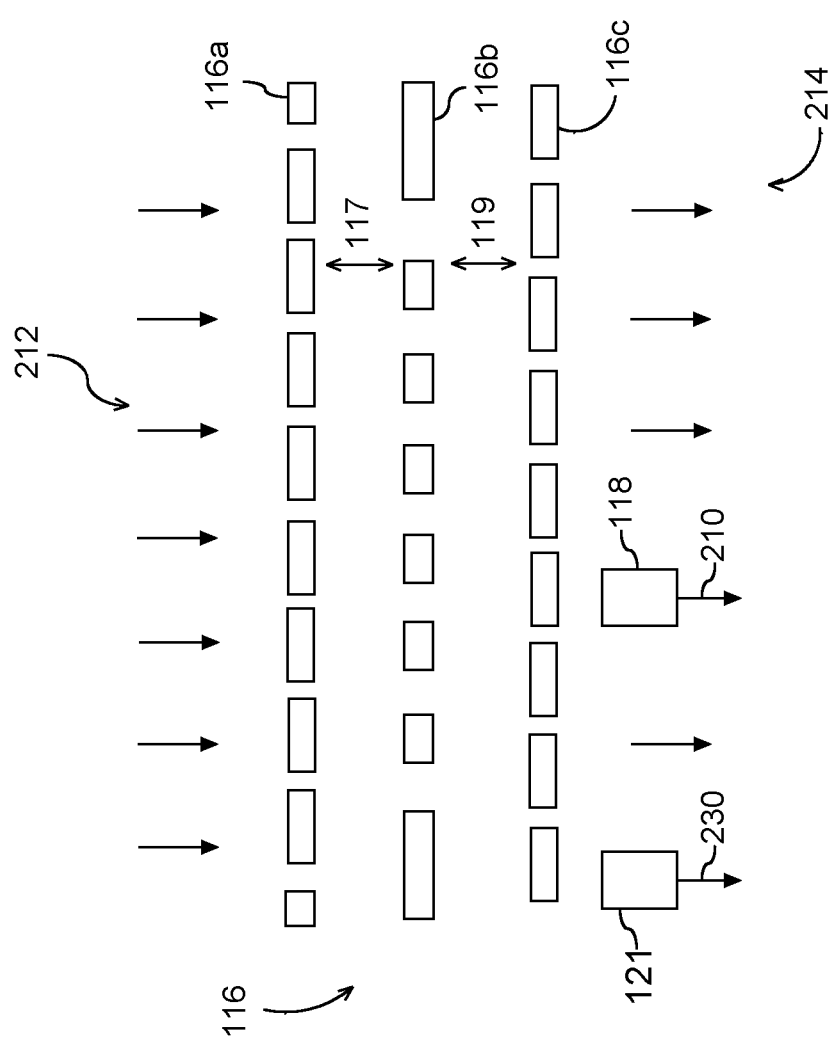
FIG. 13 depicts example post plasma gas injection at a separation grid according to example embodiments of the present disclosure.

FIG. 13 depicts a separation grid 116 similar to that illustrated with respect to FIGS. 2-12. The separation grid 116 includes at least one gas port 118 configured to inject gas 210 below the grid plate 116*c* beneath a bottom surface of the separation grid 116. As shown, the gas port 118 is configured to inject gas 210 in a vertical direction away from the separation grid (e.g., in a center zone). The separation grid 116 can include a gas port 121 configured to inject gas 230 below the grid plate 116*c* beneath a bottom surface of the separation grid 116. As shown, the gas port 121 is configured to inject gas 230 in a vertical direction away from the separation grid (e.g., in a peripheral zone).

The gas 210 can be the same as or different from the gas 230. The first gas 210 can have the same temperature or a different temperature relative to the gas 230. The first gas 210 can have the same flow rate or a different flow rate relative to the gas 230. The gas 210 can have the same chemical makeup or a different chemical makeup relative to the gas 230, etc. In some embodiments, the gas 210 and/or gas 230 can be an inert gas, such as helium, nitrogen, and argon.

Figure 14:
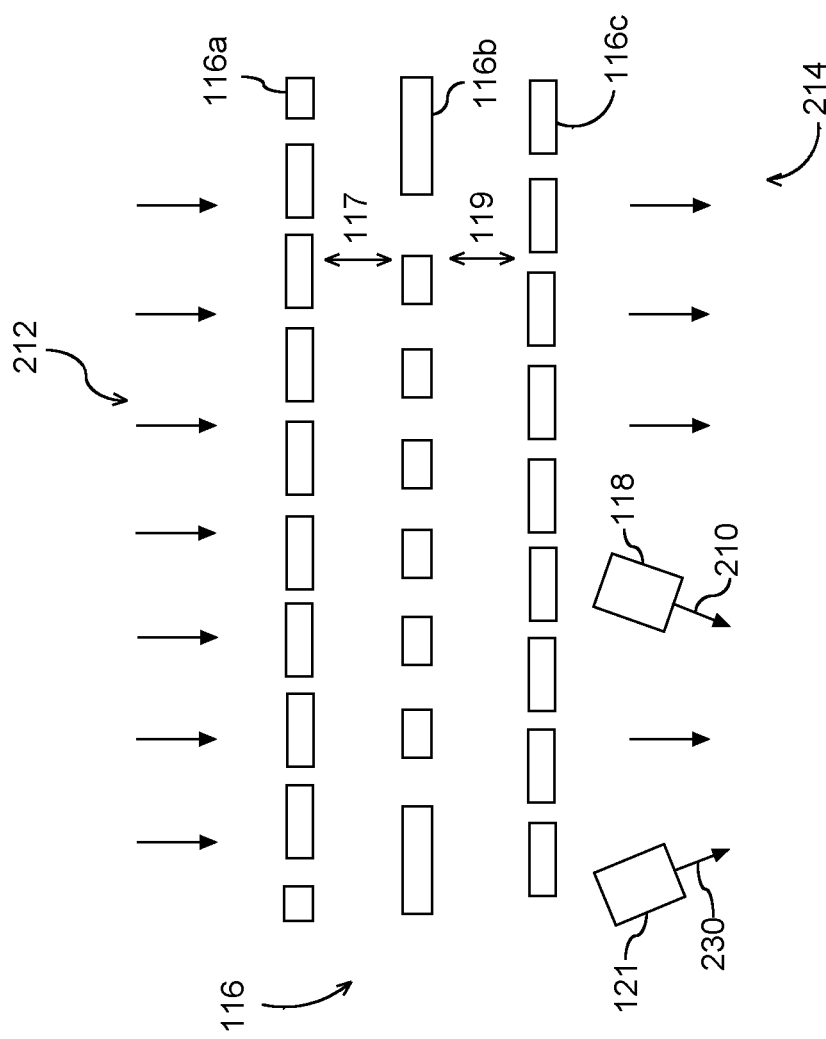
FIG. 14 depicts example post plasma gas injection at a separation grid according to example embodiments of the present disclosure.

FIG. 14 depicts a separation grid 116 similar to that illustrated with respect to FIGS. 2-13. The separation grid 116 includes at least one gas port 118 configured to inject gas 210 below the grid plate 116*c*. As shown, the gas port 118 is configured to inject gas 210 in a oblique direction away from the separation grid 116. The separation grid 116 can include a gas port 121 configured to inject gas 230 below the grid plate 116*c* beneath a bottom surface of the separation grid 116. As shown, the gas port 121 is configured to inject gas 230 in an oblique direction away from the separation grid The gas 210 can be the same as or different from the gas 230. The first gas 210 can have the same temperature or a different temperature relative to the gas 230. The first gas 210 can have the same flow rate or a different flow rate relative to the gas 230. The gas 210 can have the same chemical makeup or a different chemical makeup relative to the gas 230, etc. In some embodiments, the gas 210 and/or gas 230 can be an inert gas, such as helium, nitrogen, and argon.

Figure 15:
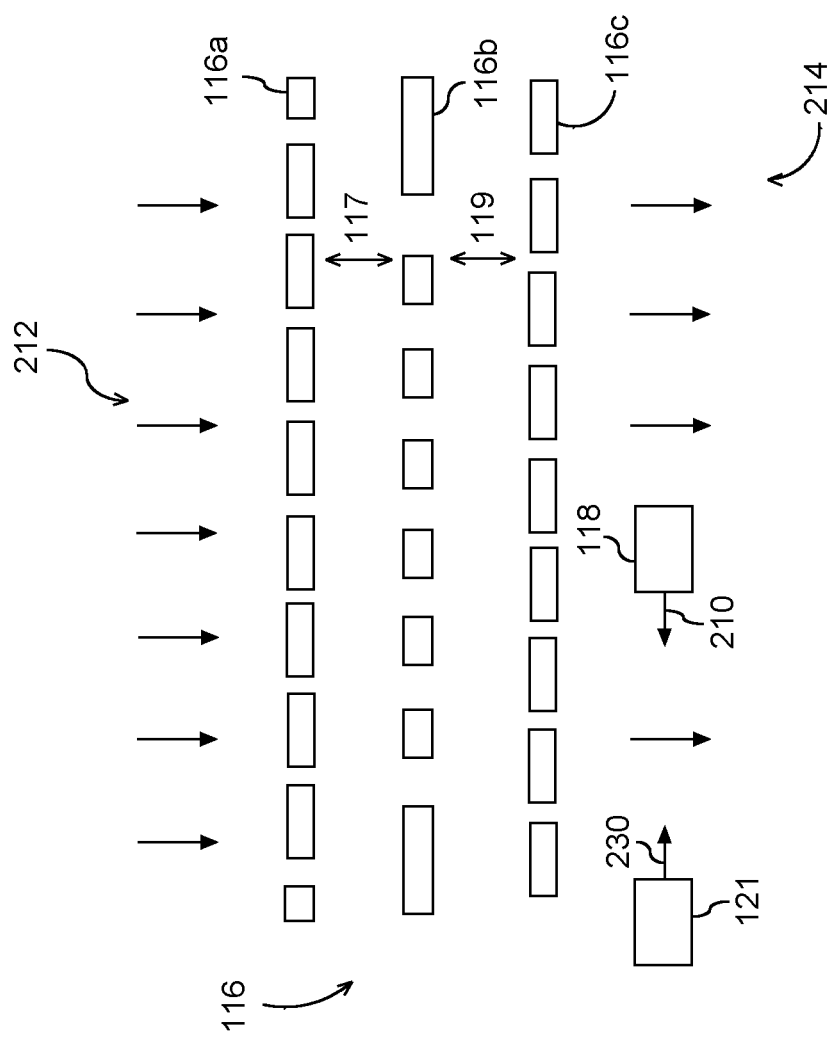
FIG. 15 depicts example post plasma gas injection at a separation grid according to example embodiments of the present disclosure.

FIG. 15 depicts similar to that illustrated with respect to FIGS. 2-14. The separation grid 116 includes at least one gas port 118 configured to inject gas 210 below the grid plate 116*c*. As shown, the gas port 118 is configured to inject gas 210 in a horizontal direction towards the periphery of the separation grid 116. The separation grid 116 can include a gas port 121 configured to inject gas 230 below the grid plate 116c beneath a bottom surface of the separation grid 116. As shown, the gas port 121 is configured to inject gas 230 in a horizontal direction towards the center of the separation grid 116.

The gas 210 can be the same as or different from the gas 230. The first gas 210 can have the same temperature or a different temperature relative to the gas 230. The first gas 210 can have the same flow rate or a different flow rate relative to the gas 230. The gas 210 can have the same chemical makeup or a different chemical makeup relative to the gas 230, etc. In some embodiments, the gas 210 and/or gas 230 can be an inert gas, such as helium, nitrogen, and argon.

Certain example embodiments are discussed with reference to injecting a gas at a separation grid in a center zone and a peripheral zone. More zones with gas injection at the separation grid can be provided without deviating from the scope of the present disclosure, such as three zones, four zones, five zones, six zones, etc. The zones can be partitioned in any manner, such as radially, azimuthally, or in any other manner. For instance, in one example, post plasma gas injection at the separation grid can be divided into a center zone and four azimuthal zones (e.g., quadrants) about the periphery of the separation grid.

The post plasma gas injection illustrated in FIGS. 2-15 are provided for example purposes. Those of ordinary skill in the art will understand that there are a variety of different configurations for implementing one or more gas ports in a separation grid for post plasma injection according to example embodiments of the present disclosure. The one or more gas ports can be arranged between any grid plates, can inject gas in any direction, and can be used to for multiple post plasma gas injection zones at the separation grid for uniformity control.

Figure 16:
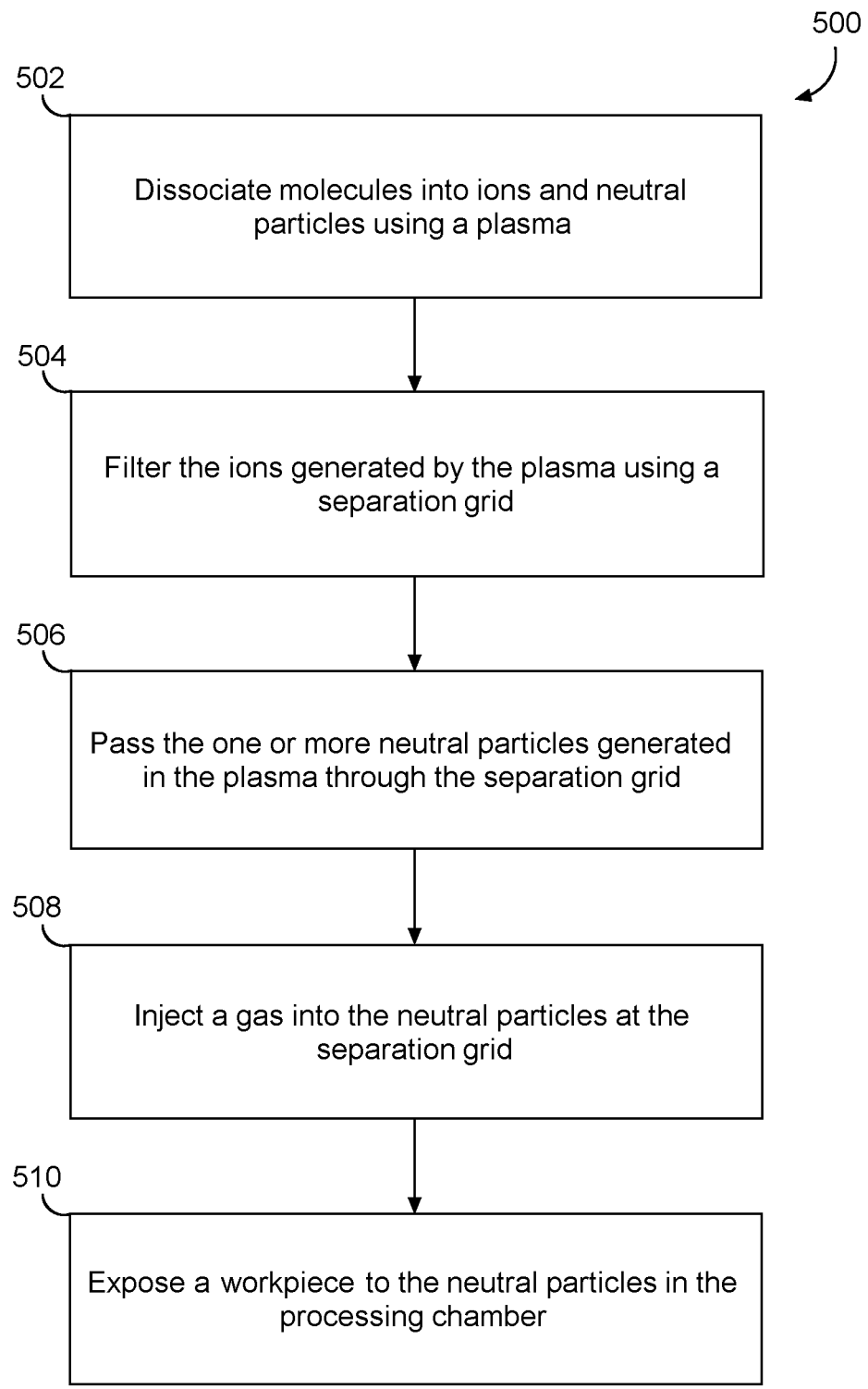
FIG. 16 depicts an example method of processing a workpiece according to example embodiments of the present disclosure.

FIG. 16 depicts a flow diagram of an example method (500) according to example embodiments of the present disclosure. The method (500) will be discussed with reference to the plasma processing apparatus 100 of FIG. 1 by way of example. The method (500) can be implemented in any plasma processing apparatus having a plasma chamber that is separate from a processing chamber with a separation grid with post plasma injection according to example embodiments of the present disclosure.

FIG. 16 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the method can include dissociating one or more molecules in the mixture in the plasma chamber interior using the plasma. For instance, a plasma induced in the plasma chamber interior 125 using the inductively coupled plasma source 135 can dissociate molecules in a process gas to generate neutral particles (e.g. radicals) and ions.

At (504), the method can include filtering one or more ions generated by the plasma in the mixture using a separation grid. For instance, the mixture containing neutral particles and ions can be passed through a separation grid which can filter the one or more ions generated by the plasma. For example, the mixture can be passed from plasma chamber interior 125 through separation grid 116.

At (506), the neutral particles generated by the plasma in the mixture can be passed through the separation grid. For example, the neutral particles can pass through the separation grid 116 into the processing chamber 110 while the ions are blocked (e.g., recombine) by the separation grid 116. Example separation grids are illustrated in FIGS. 2-15.

At (508) of FIG. 16, the method can include injecting a gas at the separation grid. For example, the gas can be injected into the separation grid 116 at one or more gas ports 118, 121 formed between the one or more grid plates 116a, 116b, 116c. Injecting a gas can include injecting a neutral gas, such as nitrogen, helium, or argon. Injecting a gas can include injecting a cooling gas have a temperature less than a temperature of radicals passing through the separation grid.

At (510), the method can include exposing the workpiece to the filtered mixture. More particularly, the workpiece can be exposed to neutral particles generated in the plasma and passing through the separation grid. The neutral particles can be used, for instance, as part of a surface treatment process (e.g., photoresist removal).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece in a plasma strip tool, the method comprising:
    dissociating one or more molecules into one or more ions and one or more neutral particles in a mixture using a plasma generated in a plasma chamber of a plasma processing apparatus;
    filtering the one or more ions generated by the plasma in the mixture using a separation grid comprising a first grid plate and a second grid plate wherein the first grid plate and the second grid plate are disposed between the plasma chamber and a processing chamber of the plasma processing apparatus, the processing chamber being separated from the plasma chamber by the separation grid;
    passing the one or more neutral particles generated in the plasma through first holes extending through the first grid plate and through second holes extending through the second grid plate of the separation grid, the first and second holes being separate from each other;
    controlling energy of the neutral particles passing through the separation grid by injecting a cooling gas into the neutral particles passing through the separation grid into the processing chamber from a gas injection port located between the first grid plate and the second grid plate of the separation grid; and
    exposing the workpiece to the neutral particles in the processing chamber.

2. The method of claim 1, wherein the cooling gas is an inert gas.

3. The method of claim 1, wherein injecting the cooling gas into the neutral particles comprises injecting a cooling gas into neutral particles at a first portion of the separation grid and injecting a cooling gas into neutral particles at a second portion of the separation grid.

* * * * *